United States Patent [19]

Heimer

[11] 4,419,013
[45] Dec. 6, 1983

[54] PHASE CONTRAST ALIGNMENT SYSTEM FOR A SEMICONDUCTOR MANUFACTURING APPARATUS

[75] Inventor: Richard J. Heimer, Encino, Calif.

[73] Assignee: TRE Semiconductor Equipment Corporation, Woodland Hills, Calif.

[21] Appl. No.: 280,878

[22] Filed: Jul. 6, 1981

Related U.S. Application Data

[63] Continuation-in-part of Ser. No. 248,805, Mar. 30, 1981.

[51] Int. Cl.³ .......................................... G01B 11/27
[52] U.S. Cl. .................................. 356/400; 356/401
[58] Field of Search ............... 250/557, 561; 350/509; 356/354, 363, 399–401

[56] References Cited

U.S. PATENT DOCUMENTS

| | | | |
|---|---|---|---|
| 2,660,923 | 12/1953 | Benford | 350/509 |
| 4,153,371 | 5/1979 | Koizumi et al. | 356/401 |

FOREIGN PATENT DOCUMENTS

| | | | |
|---|---|---|---|
| 318006 | 1/1972 | U.S.S.R. | 356/399 |

OTHER PUBLICATIONS

C. H. Walow et al., "Universal Automatic Wafer Fine Alignment & Positioning System", IBM Tech. Disc. Bull. 8/74, pp. 866–872.

Wren, L. A., "Understanding & Using the Phase Microscope", Unitron Educational Publication, 1963, pp. 32–36.

*Primary Examiner*—William H. Punter
*Attorney, Agent, or Firm*—Spensley, Horn, Jubas & Lubitz

[57] ABSTRACT

A masking apparatus for use in the production of semiconductor devices. In order to achieve alignment beween successive masking operations, alignment targets are formed on a semiconductor wafer adjacent circuit patterns which are exposed onto the wafer. The alignment targets are viewed during subsequent masking steps in order to align the previously exposed circuit patterns with a new pattern contained on a reticle. In many masking steps, the alignment target is covered with one or more highly reflective films, which decreases the ability to view the alignment target. A phase contrast microscope is utilized to enable the embedded alignment targets to be viewed despite the existence of the overlying reflective films. The micrscope incorporates an illumination subsystem containing an annular diaphragm and an observation subsystem containing a phase plate. The image of the alignment target which is formed by the phase contrast microscope includes a bright edge halo which may be utilized in determining the position of the target.

8 Claims, 16 Drawing Figures

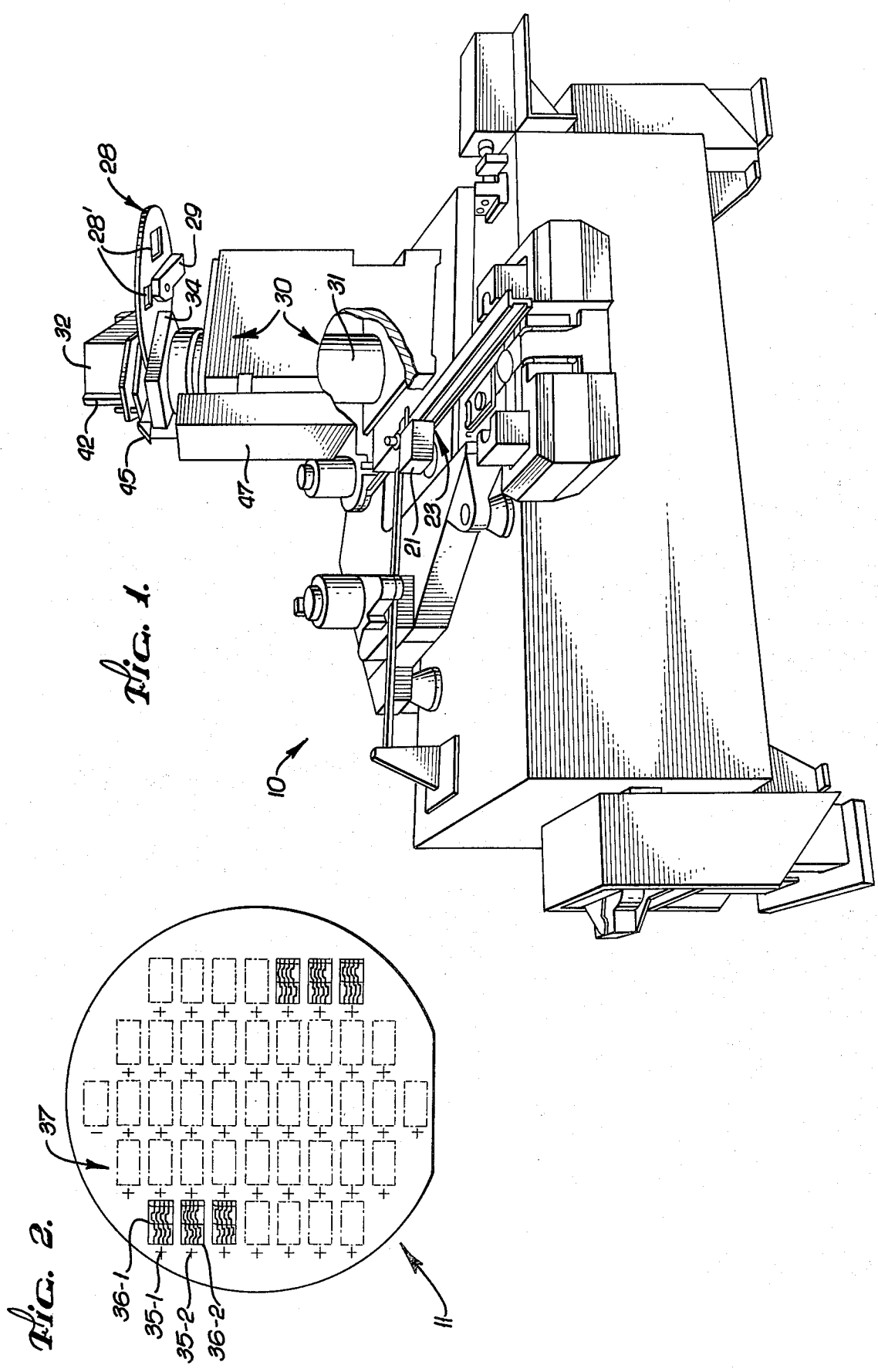

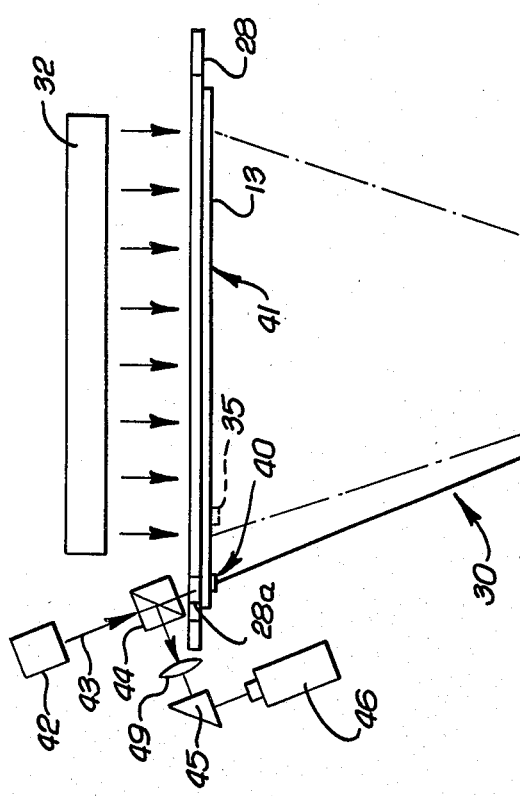
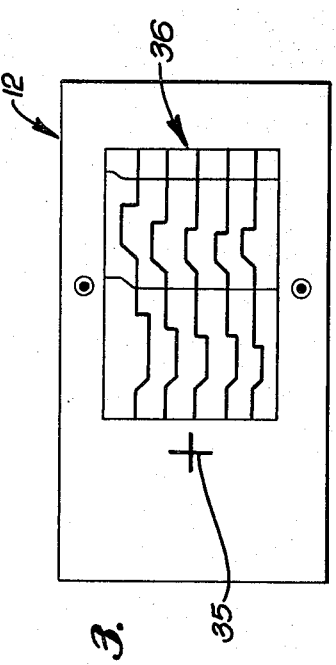
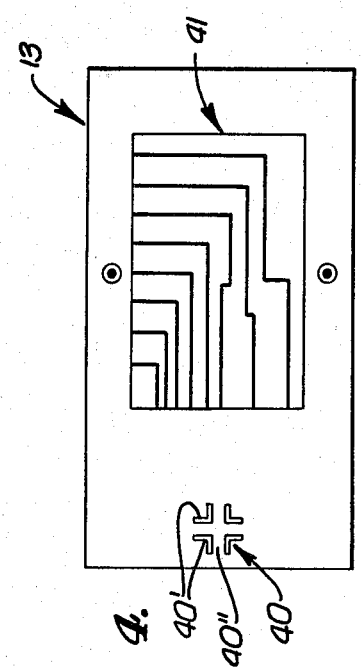
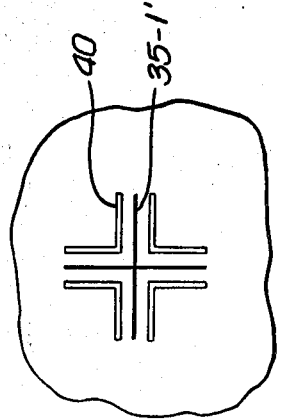

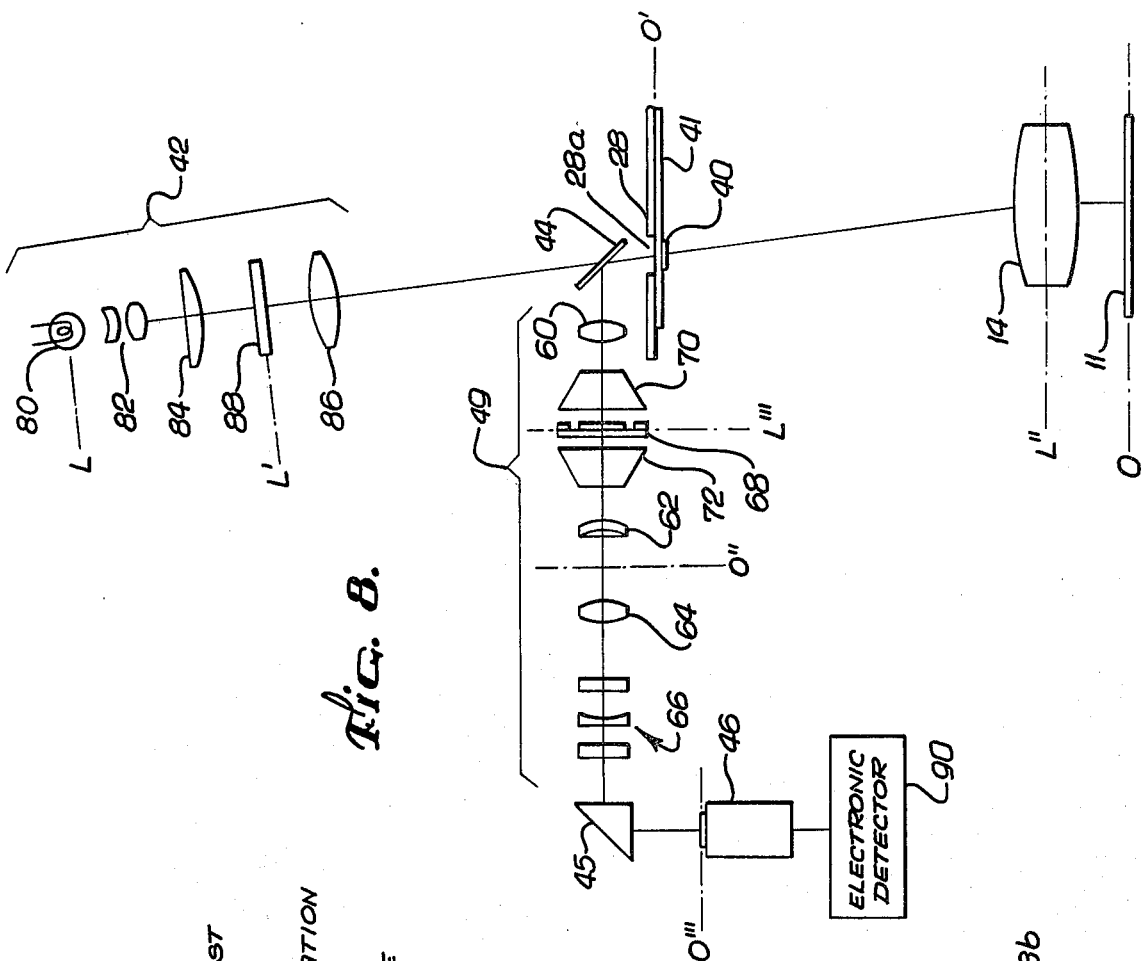
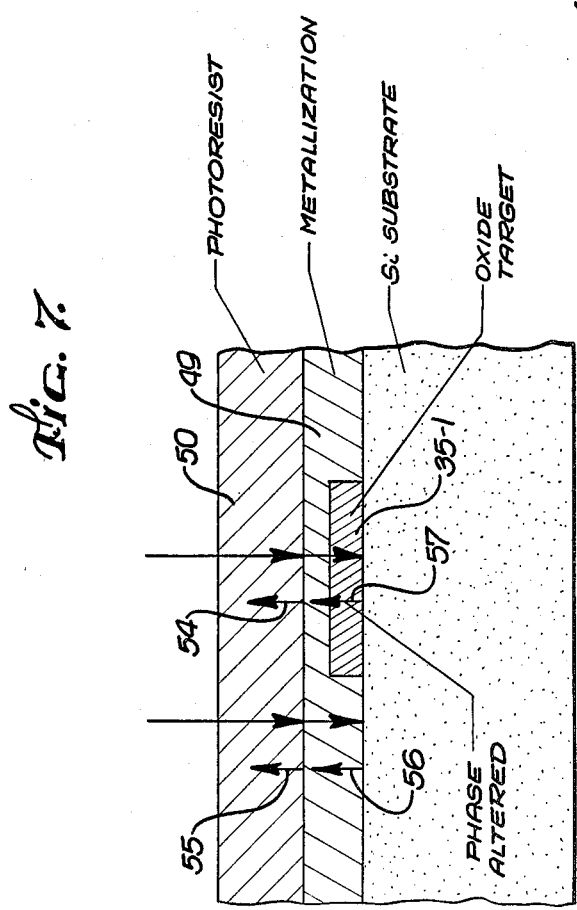
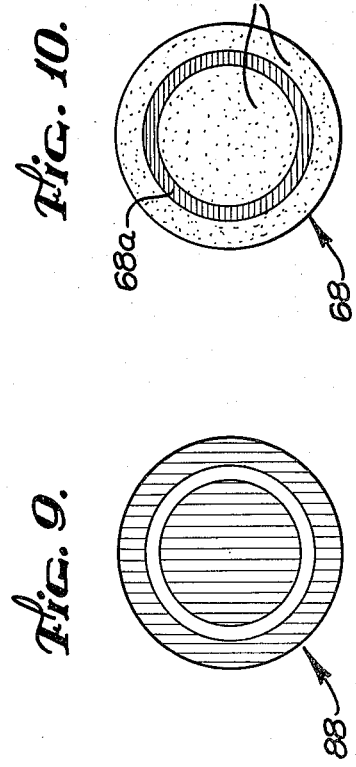

PHASE CONTRAST ALIGNMENT SYSTEM FOR A SEMICONDUCTOR MANUFACTURING APPARATUS

BACKGROUND OF THE INVENTION

CROSS-REFERENCE TO RELATED APPLICATION

This is a continuation-in-part of copending U.S. application Ser. No. 248,805, filed Mar. 30, 1981.

FIELD OF THE INVENTION

The present invention relates to masking systems used in the production of semiconductor devices. More particularly, the present invention relates to a step and repeat direct exposure system for repeatedly exposing a semiconductor wafer to a circuit or device pattern contained on a reticle. The invention also relates to such a system in which during one or more masking operations an alignment target is placed on the wafer at each circuit location. During subsequent masking operations, image alignment is achieved by simultaneously viewing superimposed images of both an alignment pattern contained on the reticle to be exposed and the alignment target on the wafer. Specifically, the present invention is directed to the provision of a phase contrast viewing system for improving the ability to detect an alignment target on the wafer.

In the fabrication of integrated circuits and discrete semiconductor devices, many identical devices or circuits are formed on a single semiconductor wafer. Typically the wafer is of silicon, and has a diameter on the order of three to five inches. Depending on the size of the device or circuit, upwards of fifty, a hundred or more such items may be formed on a single wafer. At the end of the fabrication process, the wafer is scribed and split to form separate dies each containing an individual device or circuit. These dies then are separately packaged to complete the fabrication.

Many successive process operations are carried out on each wafer. The number and type of such process steps will differ depending on the type of device that is being fabricated. For example, different process steps will be used to form circuits having bipolar transistors, metal gate field effect transistors, silicon gate field effect transistors, or C-MOS (complementary metal-oxide semiconductor) devices, to name but a few. Common to all of these processes, however, is the necessity for photographically defining specific areas within each circuit or device at which process operations occur. This is accomplished by projecting an image of one or more device patterns from a reticle onto the wafer. From as few as three to as many as twelve such photographic "masking" operations are carried out on each wafer during the fabrication process.

It is of utmost importance that each successive mask be properly aligned with the circuit or device patterns that were defined by earlier masking steps. This alignment is critical to proper functioning of the completed device. Misregistration by even very small amounts can render a device inoperative. Misregistration problems result in very low yields, with a resultant increase in device manufacturing costs.

The problem of mask misregistration becomes even more critical as the density of individual components in each integrated circuit increases. To form an integrated circuit having a large number of individual components requires that each of these components be extremely small. In today's integrated circuits, element spacings as small as 2 micrometers may be demanded. Such fine resolution places exceedingly close tolerance demands on the registration of successive photographic masks during the fabrication process. Indeed, the degree to which such successive registration can be achieved is one of the principle factors limiting the density or number of devices per square centimeter that can be achieved in large scale integrated circuits.

During a masking step, an alignment target which was formed on the wafer during a previous masking step will be covered by one or more thin films, such as oxide, metallization and photoresist films. Alignment between the alignment target and an alignment mark contained on a reticle therefore requires that the target be viewed through the films. In most instances, the overlying films are essentially transparent and an operator has little difficulty in viewing the alignment target through them. Certain films, however, particularly metallization films used to form contacts and leads, are highly reflective. The reflective nature of these films greatly reduces the ability to see the alignment target.

DESCRIPTION OF THE PRIOR ART

Prior alignment systems have utilized a microscope to permit simultaneous viewing of the wafer alignment target and reticle alignment mark. Either the reticle or wafer is moved until alignment between the wafer target and reticle mark is achieved. Systems of this type are disclosed in U.S. Pat. Nos. 4,052,603 to Karlson and 4,153,371 to Koizumi et al., as well as in U.S. application Ser. No. 038,348, filed May 11, 1979 and assigned to TRE Corporation, the same assignee of the present invention. In each of these systems, the reduction lens used for exposure of a reticle pattern also functions as the objective lens of the microscope. The wafer alignment target is viewed by illuminating the wafer in the area of the target. The microscope in these systems is a bright field microscope, and the alignment target is visible due to amplitude differences between light reflected from the target and the surrounding area of the wafer.

When highly reflective films overlie the alignment target as discussed above, much of the light striking the wafer structure will be reflected from the surface of the film rather than the surface of the wafer. This greatly reduces the contrast between the alignment target and the surrounding area when viewed through the microscope, as can be seen in FIG. 11. That is, the difference in amplitude of light reflected from the wafer structure in the area of the alignment target as compared to that reflected from the surrounding area becomes smaller as the overlying films become more reflective. Accordingly, it is an object of the present invention to provide a mask alignment system in which the ability to detect a wafer alignment targets is improved. A further object of the present invention is to provide a step and repeat exposure system in which detection of the alignment mark is improved to such an extent that the use of an automatic alignment system becomes feasible.

SUMMARY OF THE INVENTION

These and other objectives are achieved by providing a system which utilizes a unique phase contrast microscope to view the alignment targets, rather than employing a standard amplitude sensitive bright field microscope as has been used in the past. The phase contrast microscope provides an image which is a function of phase differences of light reflected from the alignment target as compared to the surrounding area. The provision of a phase enhanced image of the alignment target greatly increases the ability to see the alignment target through reflective films.

During the alignment operation, a low intensity, narrow beam light source is used to illuminate an alignment target contained on the wafer. Some light will be reflected by the films overlying the wafer. The remaining light will pass through the overlying films and be reflected from the surface of the wafer. Due to the different reflective index of the alignment target and the fact that reflective surface of the alignment target may be in a different plane than that of the surrounding area, light incident on the alignment target will have a different optical path length than that incident on the surrounding area. The different path length causes light reflected from the alignment target to be shifted in phase with respect to light reflected from the surrounding area.

An optical system including a unique phase contrast microscope and a video camera is used to simultaneously view the wafer alignment target and a complementary alignment mark contained on a reticle. The microscope includes an annular diaphragm in an illumination subsystem and a phase plate in a separate observation subsystem. This configuration overcomes problems associated with achieving phase contrast operation in an incident light type microscope. By employing a phase contrast microscope, the ability to view the wafer alignment target is greatly increased. Either the stage holding the wafer or the reticle can be moved to achieve perfect alignment between the target and the alignment mark. Once alignment is achieved, the wafer is exposed according to the circuit pattern contained on the reticle.

Typically, phase contrast microscopes are of the transmitted light type, i.e., the light source and viewing optics are on opposite sides of a transparent stage. Phase contrast operation is difficult to achieve with incident light microscopes because of problems associated with placement of the phase plate so as to not interfere with projection of light to the object under inspection. The present invention provides a unique incident light type phase contrast microscope which incorporates a phase plate in an observation subsystem so that it does not interfere with the illumination of the alignment target.

Due to various interference effects, specimen images formed by phase contrast microscopes are surrounded by a bright edge halo. In most situations, this halo effect is undesirable, since it reduces the overall clarity of the image. In the present invention, however, the halo is used advantageously to increase the accuracy of determination of the position of the alignment target. The halo forms a spike in a video scan of the image of the alignment target. The position of the spike can be readily detected by the use of slope detection electronics or the like. The detected position can then be used to calculate the position of the center of the alignment target.

In a preferred embodiment, the system includes a step and repeat apparatus in which alignment of an image of a reticle alignment mark and an alignment target is accomplished through the same camera lens system that is used to make the exposures. The exposures are made repetitively and sequentially at successive array locations on a wafer, and an appropriate wafer stepper system is used to move the wafer between each exposure.

BRIEF DESCRIPTION OF THE DRAWINGS

A detailed description of the invention will be made with reference to the accompanying drawings wherein like numerals designate corresponding parts in the several Figures. The drawings are not necessarily to scale.

FIG. 1 is a perspective view of a step and repeat apparatus for direct photo-exposure of a semiconductor wafer.

FIG. 2 is a top plan view of a wafer exposed using the apparatus of FIG. 1.

FIG. 3 is a top plan view of a reticle containing an image to be exposed onto the wafer being processed. This reticle includes a cruciform alignment target which is exposed onto the wafer at each image location, as shown in FIG. 2.

FIG. 4 is a top plan view of a reticle utilized in a later processing step. It contains a complementarily shaped alignment mark which is used to align the image of the reticle with the target previously provided on the wafer using the reticle of FIG. 3.

FIG. 5 is a diagrammatic view of the image alignment system used in the apparatus of FIG. 1.

FIG. 6 is a fragmentary view of the wafer alignment target virtual image superimposed on the reticle alignment pattern, as seen through the optical system of FIG. 5.

FIG. 7 is a sectional view of a portion of a typical wafer structure containing an alignment target.

FIG. 8 is a plan view of the microscope system used in the present invention.

FIG. 9 is a plan view of an annular diaphragm used in the present invention.

FIG. 10 is a plan view of a phase plate used in the present invention.

DESCRIPTION OF THE PREFERRED EMBODIMENT

Figure 11:
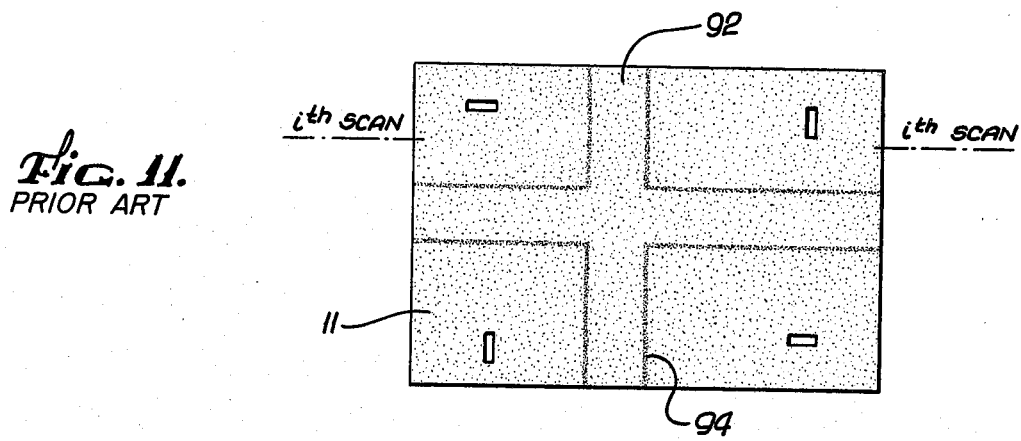
FIG. 11 is a plan view of the video image of an alignment target produced by a prior art system.

The following description is of the best presently contemplated mode of carrying out the invention. This description is not to be taken in a limiting sense, but is made merely for the purpose of illustrating the general principles of the invention since the scope of the invention best is defined by the appended claims.

The apparatus 10 of FIG. 1 is used to expose directly and repetitively portions of a semiconductor wafer 11 (FIG. 2) to an image contained on a reticle 12 (FIG. 3) or 13 (FIG. 4). As described below, the alignment of each new image with a pattern previously placed on the wafer 11 is carried out through the same camera optics that is used for the direct exposure of each reticle image. The basic operation of the apparatus 10 is fully described in prior application Ser. No. 038,348 filed May 11, 1979.

The step and repeat direct exposure process is carried out with the wafer 11 situated on a movable stage 23. The exposure is performed with the appropriate reticle 12 or 13 mounted in a reticle holder 28 that is pivotably attached to a support 29 near the top of the apparatus 10. Several different reticles 12, 13 (FIGS. 3, 4) may be premounted in corresponding openings 28' in the holder 28 and rotated into position in a camera 30 as required.

The camera 30 (FIGS. 1 and 5) includes a vertically mounted, generally cylindrical camera body 31 which contains appropriate optics 14 for focusing a reduced image of the reticle 12, 13 pattern onto the wafer 11 that is mounted on the stage 23. The optics 14 may utilize one or a plurality of lenses to accomplish the requisite focusing operation. In the present embodiment, the optics 14 is a telecentric lens system, i.e., one in which the focal plane is at infinity. A high intensity exposure lamp 32 is used as a light source, typically at 4360 A, to expose photoresist on the wafer 11.

Each wafer 11 undergoes a series of device fabrication steps, certain of which require separate masking or pattern exposure steps. During the initial masking operation, the reticle 12 (FIG. 3) is used. This first reticle contains a cruciform alignment target 35, an image of which is exposed onto the wafer 11 simultaneously with exposure of a pattern 36 contained on the same reticle 12. The target 35 is formed a predetermined distance from the pattern 36.

Using a step and repeat direct exposure operation, multiple images of the pattern 36 and cruciform alignment target 35 are produced in a desired array 37 on the wafer 11 (FIG. 2). After formation of the array 37, the wafer 11 is removed from the apparatus 10. After appropriate semiconductor processing steps have been carried out, the wafer 11 is returned to the apparatus 10 for the next masking operation. This operation utilizes the reticle 13 (FIG. 4) having an alignment mark or pattern 40 that advantageously has a shape which is complementary to the alignment target 35 of the reticle 12. In the embodiment shown, the mark 40 consists of four L-shaped elements 40' arranged to define an open cruciform area 40" corresponding in shape to the alignment target 35. Alternatively, the alignment pattern could be comprised of an opaque area surrounding a transparent rectangular window. The reticle 13 also contains a new circuit pattern 41 which is different from the pattern 36, but which must be exposed onto the wafer 11 in precise overlapping alignment with the each pattern 36-1, 36-2, etc. that was produced using the first reticle 12. The alignment mark 40 is spaced a predetermined distance from the circuit pattern 41 which is greater than the spacing between the target 35 and its corresponding pattern 36.

The mark 40 (or window) previously exposed alignment target 35 are used to achieve perfect overlapping alignment between an image of the reticle pattern 41 and the previously exposed pattern 36. To this end, an image 35-1' of the wafer alignment target 35-1 is formed by the camera optics 14. The stage 23 is moved appropriately so that this image of the target 35-1 (that was previously produced on the wafer 11) is precisely aligned with the alignment mark 40 on the reticle 13. When the desired alignment is achieved, the overlapping alignment mark 40 and alignment target will have the appearance generally like that shown in FIG. 6. (When the alignment indicia on the reticle is a transparent window, the image of the alignment target is viewed through the window and alignment is achieved by centering the image of the target within the window.) When this alignment between the target 35-1 and mark 40 is achieved, the corresponding device patterns 36-1 and 41 will be out of alignment by a small amount, due to the different spacings between the patterns 41 and 36-1 and their respective alignment mark and target. After a slight predetermined amount of movement of the stage to make up for this spacing differential, the lamp 32 is flashed to expose the wafer 11 to an image of the pattern 41. Perfect alignment between the patterns 36-1 and 41 is achieved. The stage 23 then is moved to the next image position, and the process is repeated.

To facilitate viewing of the alignment target, a separate low intensity light source 42 is used to illuminate the wafer in the area of the alignment target 35-1 through the camera optics 14, as shown in FIG. 5. The light source 42 may be of sufficiently low intensity so that it does not significantly expose an overlying layer of photoresist on the wafer 11 (i.e., it is not exposed enough to produce an opening in the photoresist layer when developed and etched). The wavelength of the light source may be the same as that of the high intensity flash lamp 32. Light 43 from the light source 42 passes through a beam splitter 44, through an opening 28a in the holder 28, through the mark 40 on the reticle 13 and finally through the optics 14 so as to produce the illumination at the location of the target 35-1. The virtual image of the wafer alignment target 35-1 is projected back through the optics 14 and is focused at the plane of the reticle 13. The mark 40 and the image of the alignment target 35-1 are simultaneously viewed by means of a prism 45 and a video camera 46, shown diagrammatically in FIG. 5 and contained within a housing 47 of FIG. 1.

The alignment target 35 on the reticle 12 is positioned relatively close to the pattern 36 so that it will be exposed along with the pattern 36 onto the wafer 11 by the flash lamp 32. That is, the target 35 will be in a location as shown in phantom in FIG. 5 when the reticle 12 is positioned in the holder 28. The alignment mark 40 is not exposed onto the wafer but is used only for alignment of the pattern 41 with previously exposed patterns. Therefore, the mark 40 is spaced a relatively large distance from the pattern 41, so that it will be located beneath the opening 28a rather than beneath the flash lamp 32. Because of this difference in spacing, the stage must be moved after alignment between the target 35-1 and mark 40 is achieved in order to achieve the desired alignment between the patterns 36-1 and 41. This movement is a small fixed distance which does not introduce error into the alignment procedure. The alignment operation thus includes the steps of moving the stage into position so that the pattern 36-1 is generally in the location desired, aligning the mark 40 with the target 35-1, moving the stage by a slight predetermined amount in order to align the patterns 36-1 and 41, and exposing the pattern 41 onto the wafer 11 by means of the flasm lamp 32.

FIG. 7 shows a typical wafer and overlying film structure which may be encountered during an alignment procedure. The alignment target 35-1 is shown as an oxide mesa (approximately 3000 A thick) on the surface of the wafer 11. It should be recognized that the target 35-1 could be formed by various methods, e.g., it could be a hole formed in an oxide film on the wafer surface or a crater etched in the surface of the wafer.

Irrespective of how the target is formed, it is covered by one or more thin films prior to each masking operation. During the alignment procedure, the alignment target must therefore be viewed through the overlying films. In many cases, the films are essentially transparent and there is little difficulty in viewing the alignment target. Some films are highly reflective, however, thereby greatly increasing the difficulty of viewing the alignment target. Metallization layers used to make electrical connections to the semiconductor devices formed in the wafer are particularly reflective and thus present the greatest problems. In the structure shown in FIG. 7, a 6000 A thick highly reflective polysilicon layer 49 overlies the wafer 11 and alignment target 35-1, and a 10,000 A layer of photoresist 50 covers the polysilicon layer. In order to view the alignment target, light from the light source 42 must pass through the photoresist layer 50 and the polysilicon layer 49. Because of the highly reflective nature of the polysilicon layer 49, a large portion of the incident light is reflected from its top surface, as indicated by arrows 54 and 54. Light which is not reflected by the layer 50 passes through it and is reflected from the surface of the wafer 11, as shown by arrow 56. Light incident on the target 35-1 will pass through the target and be reflected from the surface of the wafer, as indicated by arrow 57.

Prior art alignment systems detect the presence of the alignment target 35-1 by determining the difference in amplitude of light reflected from the wafer surface under the target (as shown by arrow 57) as compared to the amplitude of light reflected from the surrounding area (shown by arrow 56). When the component of light reflected from the overlying layers (shown by arrows 54 and 55) becomes high, these amplitude differences become very small and the difficulty of detection is increased. Thus, the presence of the highly reflective polysilicon layer 49 greatly reduces the contrast between the alignment target 35-1 and the surrounding area of the wafer.

The present invention increases the ability to see the alignment target by looking at phase information rather than amplitude information of light reflected from the wafer structure. Light which passes through the alignment target 35-1 before it reflects off of the wafer surface will be altered in phase with respect to surrounding light rays. This phase alteration is due to the fact that the index of refraction of the target 35-1 is different from that of the surrounding polysilicon 49 and the optical path length through the alignment target is therefore different than that through the surrounding areas. These phase differences are detected by replacing the bright field microscope of prior art systems with a phase contrast microscope.

A phase contrast microscope in general comprises a compound microscope which has an annular diaphragm added to the illumination system and a phase plate added to the viewing system. The phase plate consists of a transparent plate on which is deposited an annular ring of attenuating material (the conjugate zone) corresponding in size to the annular diaphragm. A quarter wavelength retardation film covers the remaining area of the plate. The microscope forms an image as a function of optical path length differences of light passing through objects under inspection.

The low intensity light source 42 (FIGS. 5 and 8) comprises the illumination subsystem of the phase microscope. As shown in FIG. 8, this subsystem includes a lamp 80 in a plane L, a collector lens system 82, a first condenser lens 84 and a second condenser lens 86. In addition, an annular diaphragm 88 (i.e., an opaque mask with an open ring as shown in FIG. 9) is located at the focal plane L' of the first condenser lens 84. Light produced by the subsystem 42 is passed from the beam splitter 44, through the opening 28a in the reticle holder, through the telecentric lens 14 and to the wafer 11.

The elements 45, 46 and 49 of FIG. 5 comprise the observation subsystem of the microscope. As shown in FIG. 8, the optical system 49 includes a first objective lens 60, a second objective lens 62, a field lens 64 and a tube factor lens group 66. In addition, the optical system 49 includes a phase plate 68 and adjacent enlargement and reduction telescope lens groups 70 and 72. As shown in FIG. 10, the phase plate comprises a transparent disc which includes a ring 68a of attenuating material. The remaining portion of the phase plate is covered with a film 68b which introduces a quarter wave retardation to the light passing through it. The ring 68a is referred to as the conjugate zone and the area 68b is referred to as the complementary zone.

Light produced by the illumination subsystem 42 is projected toward the wafer 11 by the prime objective lens 14. Light is reflected back to the beam splitter 44 from the surface of the wafer as well as by films on the top of the wafer. Light which passes through the oxide target 35-1 before it strikes the wafer surface (FIG. 7) will be altered in phase with respect to light which is reflected from the surrounding areas, i.e., the incident light has a different optical path length when it passes through the alignment target 35-1 as opposed to the surrounding area.

Light passing through the diaphragm 88 passes through the second condenser 86, the beamsplitter 44, the opening 28a in the reticle holder and is imaged as a ring in the entrance pupil of the prime objective lens 14 (at plane L''). Light will then strike the wafer surface at plane "O", illuminating the area containing the alignment target 35-1. (Since the wafer surface is not located at a focal plane of the diaphragm, the light striking of the wafer will not be focused as a ring but instead will illuminate a solid area.) After reflection from the wafer and beam splitter, light from the light source 80 wil be re-imaged as a ring in a plane L''' located in the observation subsystem of the microscope. The phase plate 68 is located in this plane L'''. The ring 68a of the phase plate is a conjugate of the ring of the diaphragm 88, i.e., the image of the ring of the diaphragm 88 formed at the plane L''' is the same size as the ring 68a. In the present embodiment of the invention, the enlargement telescope 70 is included to increase the ring image to a size which enables a more conveniently sized phase plate to be utilized. The reduction telescope 72 serves to restore the image size to its original state, i.e., that which it would have had without the telescope 70. It should be understood that the telescopes 70 and 72 are simply included to enable a larger phase plate to be utilized and do not alter the basic operation of the microscope.

The illumination portion of the device thus includes the annular diaphragm at plane L' with corresponding focal planes at L'' and L'''. The wafer and reticle are located in planes other than focal planes of the diaphragm, so that the wafer is illuminated and the reticle transilluminated over a solid area (i.e., the ring of the diaphragm is not focused at these planes). The observation portion of the system is such that the wafer plane O has corresponding focal planes located at O' (the reticle plane), O″ (within the optics 49) and O‴ (at the camera 46). These focal planes do not coincide with the focal planes for the light source 80 (i.e., light from the light source will not be focused as a ring of light at these planes). Images of both the alignment mark 40 and the alignment target 35-1 are formed at the plane O‴ in order to facilitate alignment. With respect to the alignment mark 40 on the reticle, light reflected from the wafer 11 transilluminates the reticle 41, and an image of the mark 40 is subsequently formed at the planes O′ and O‴. The presence of the attenuating ring 68a will not significantly affect the image of the mark 40 formed at the plane 0‴. With respect to the formation of an image of the wafer alignment target 36-1, light incident on the wafer surface which does not pass through the alignment target 35-1 (FIG. 7) will be focused as a ring at the phase plate, i.e., at L‴. This light will strike the ring 68a and will therefore be attenuated to a large extent. Light passing through the alignment target 35-1 will undergo a phase alteration with respect to light from the surrounding area due to the difference in optical path length through the target as compared to the surrounding area. In addition, light incident on the edge of the alignment target will be diffracted to a certain degree, thereby further altering its path with respect to the light incident on the surrounding area. Most of the diffracted and phase altered light will not be focused onto the phase ring 68a, but instead will pass through the complementary zone 68b. The complementary zone introduces an additional quarter wave retardation to light passing through it. This light will have suffered at least a quarter wave retardation in passing through the alignment target, and the additional retardation introduced by the phase plate causes light passing through the complementary zone 68b to interfere with light passing through the attenuating ring 68a. The amplitude reduction of light passing through the ring 68a and the interference effects cause an enhanced image of the alignment target to be formed at O″ and subsequently at O‴. This enhanced image may then be aligned with the image of the alignment mark 40.

Figure 12:
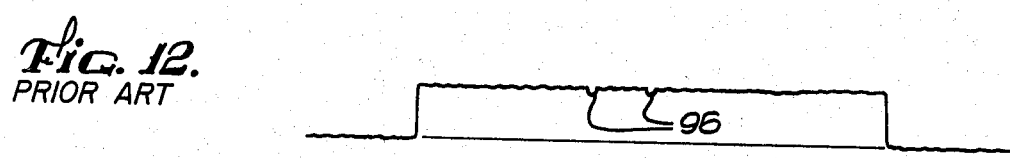
FIG. 12 is a graph showing the video output of a video camera corresponding to the i-th scan of the image of FIG. 11.
Figure 15:
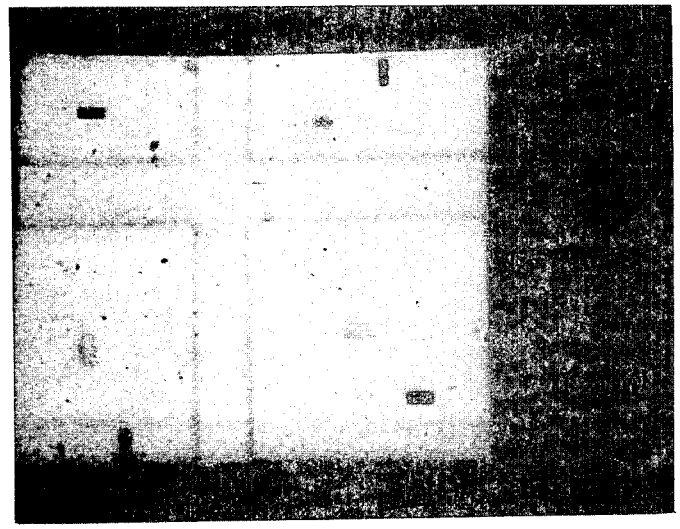
FIG. 15 is a reproduction of a photograph corresponding to FIG. 11.

When a prior art amplitude microscope is utilized to view an alignment target having a highly reflective layer over it, the image formed is a shown in FIGS. 11 and 15. The image 92 of the target 35-1 has almost the same brightness as the surrounding area of the wafer 11, due to the large amount of light reflected from the surface of the polysilicon layer. A faint outline 94 of the edge of the target is all that is visible. The video signal produced during the scanning of the i-th line is shown in FIG. 12. This signal includes slight amplitude depressions 96 corresponding to the edges of the target 35-1. Due to the small variation in the video output signal, it would be very difficult for an electronic detector to detect the position of the alignment target on the basis of this scan. Alignment on the basis of this image therefore generally requires a human operator. Even then the faintness of the target makes alignment tedious and difficult.

Figure 13:
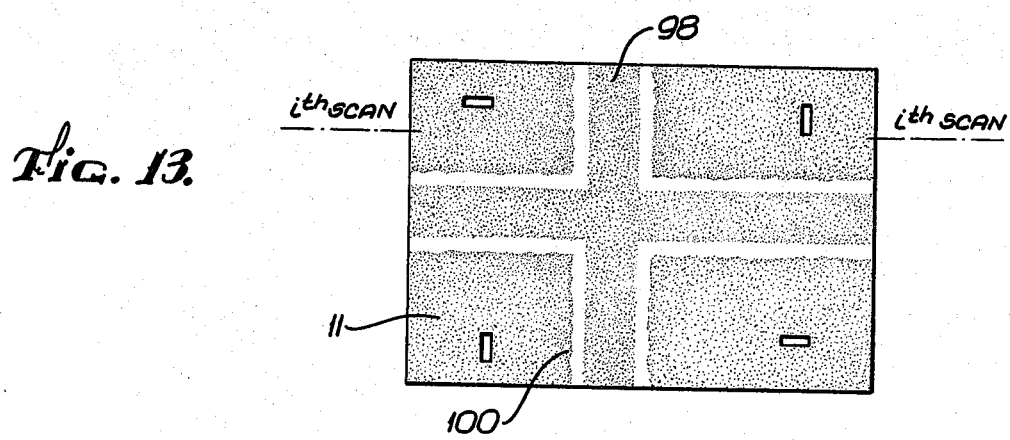
FIG. 13 is a plan view of the video image of an alignment target produced by the microscope of the present invention.
Figure 14:
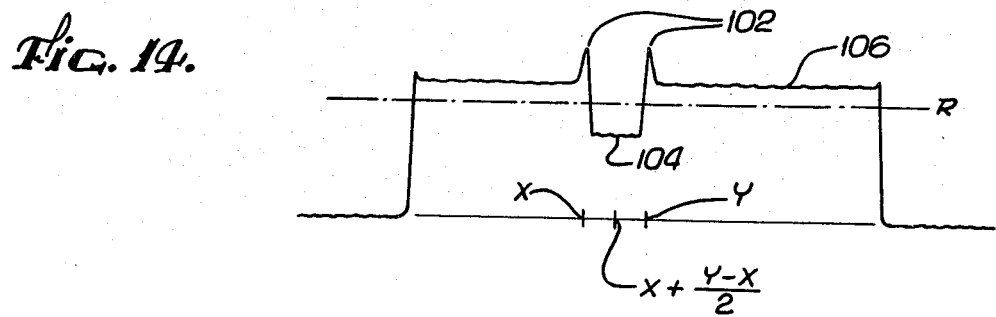
FIG. 14 is a graph showing the video output of a video camera corresponding to the i-th scan of the image of FIG. 13.
Figure 16:
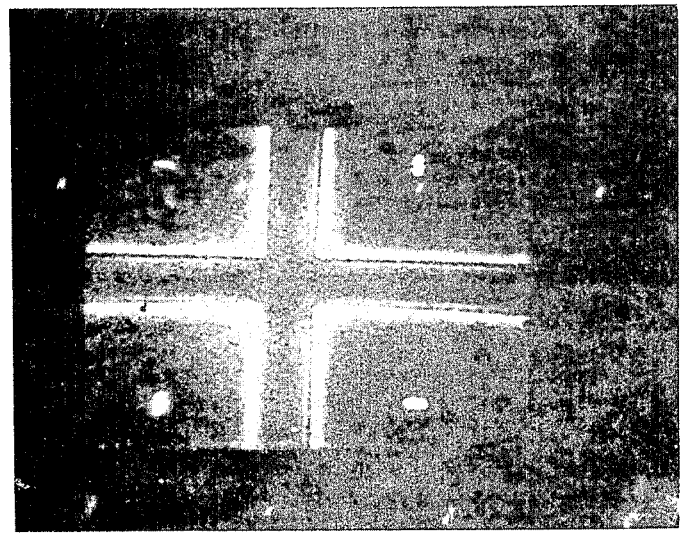
FIG. 16 is a reproduction of a photograph corresponding to FIG. 13.

The image 98 of the alignment target produced by the phase contrast microscope of the present invention is shown in FIGS. 13 and 16. In this image, the body of the alignment target 35-1 is significantly darker than the surrounding area of the wafer 11. In addition, a bright "halo" 100 is produced around the edge of the alignment target. The video signal produced at the i-th scanning is shown in FIG. 14. This scan produces spikes 102 corresponding to the edge halo, and the level of a signal 104 corresponding to the body of the alignment target 35-1 is now significantly lower than that for the surrounding area of the wafer. A comparison of FIGS. 11, 12 and 15 with FIGS. 13, 14 and 16 makes it apparent that the phase enhanced image makes it much easier to view the alignment target or to electronically detect its position.

It should be noted that in FIGS. 15 and 16 the alignment indicia utilized on the reticle is an opaque mask having a transparent window. The alignment target is visible through the window and alignment is achieved by centering the image of the target in the window. FIGS. 11 and 13 show only the window area and not the opaque area surrounding the window.

The halo effect shown in FIG. 13 is common in phase contrast microscopes. This effect is caused by the fact that some of the phase altered or diffracted light does not pass through the complementary zone of the phase plate but instead passes through the attenuating ring 68a. This light is reduced substantially in amplitude, but its phase is still altered with respect to the remaining light which passes through the attenuating ring. The phase altered light which passes through the attenuating ring constructively interferes with the non-altered light passing through the ring so as to form the bright edge halo around the image of the alignment target. In most applications (i.e., those in which the microscope is used to view a unique specimen), this halo effect is detrimental, since it reduces the accuracy and clarity of the image which is formed. In the present invention, however, the halo can be used advantageously to aid in accurate electronic detection of the position of the alignment target. The spikes 102 in the video scan which are produced by the halo can easily be detected by suitable electronics 90. The electronics may be a slope detector or similar circuit which detects the rising or falling portion of the spikes. The position of the spikes can be used to calculate the actual position of the center of the alignment target. For example, as shown in FIG. 14, if the first spike in a scan is detected at a position X and the second spike is detected at a position Y, the center of the alignment target would be located at $X+(Y-X)/2$. Utilization of the spikes thus enables very accurate detection of the relative position of the alignment target within the scan to be accomplished.

It should be noted that it is not necessary to utilize the halo-induced spikes 102 in the determination of the position of the alignment target. The amplitude differences between the portion 104 of the video signal corresponding to the body of the alignment target and a portion 106 corresponding to the surrounding area of the wafer are sufficient to enable the use of threshold circuitry to detect the target. The circuitry may simply comprise a comparator to determine when the level of the video signal exceeds a reference level. The reference level is set so that it is approximately midway between the video signal level corresponding to the target and the video signal level corresponding to the surrounding area, as indicated by a line R in FIG. 14.

Although the invention has been described in terms of an alignment target being formed only on the first layer of the wafer structure and only in conjunction with the first pattern exposure, the invention is not so limited. An alignment target may be formed during more than one masking step, and the target need not be located in the wafer or the initial overlying film. For example, if alignment between the circuit patterns formed in the fourth and fifth masking steps is critical, the original alignment target may be replaced by a new alignment target formed along with the fourth circuit pattern. In such a case, the reticle for the fourth masking step will include both an alignment mark (for alignment with the target on the wafer) and an alignment target (for exposure onto the wafer to form the new target).

In summary, the present invention is directed to a masking apparatus which incorporates a phase contrast microscope to increase the ability to detect alignment targets which may be embedded under one or more films of reflective material. The microscope is a combination of an incident light type (to view the alignment target) and a transmitted light type (to view the alignment mark on the reticle). The microscope includes a phase plate which is positioned in an observation subsystem separate from the illumination portion in order to prevent it from interfering with the illumination of the alignment target on the wafer. In the preferred embodiment, the phase contrast microscope is part of a step and repeat apparatus in which the reduction lens of the exposure system also functions as the prime objective of the phase contrast microscope. The enhanced image provided by the microscope facilitates easier alignment of the wafer pattern with a new reticle pattern. To facilitate alignment, the new reticle includes alignment indicia accurately spaced from the reticle pattern. The alignment indicia may comprise either an alignment pattern of a shape corresponding to the alignment target or a transparent window surrounded by an opaque area. The increased ability to detect the alignment target greatly increases the feasability of completely automatic alignment.

I claim:

1. In a semiconductor wafer exposure system of the type in which a semiconductor wafer containing an alignment target is moved into alignment with a reticle containing an image to be photoexposed onto said wafer, said reticle containing an alignment window that is transilluminated by light reflected from said wafer in the region of said target, said system comprising:

an incident light phase contrast microscope apparatus arranged for viewing a phase contrast image of the alignment target on said wafer through said reticle alignment window, said phase contrast image being characterized by a bright edge halo surrounding the target, and video detection apparatus, cooperating with said microscope apparatus, for detecting said image and for producing a signal indicative of the location of said halo with respect to the location of said alignment window.

2. A system according to claim 1 wherein said video detection apparatus includes a video camera and means for detecting the slope of the output of said video camera, a signal of steep slope indicating the presence and location of said halo and hence of said target.

3. An apparatus for sucessively exposing device patterns from a reticle onto a semiconductor wafer, wherein the wafer includes an alignment target and a subsequently exposed reticle includes alignment indicia which is aligned with the alignment target prior to exposure of the device pattern onto the wafer, said apparatus including a microscope system to facilitate alignment between the alignment target and the alignment indicia, comprising:

an illumination section including a light source, a first lens system and an annular diaphragm through which light from the light source is passed;

an objective lens located at a focal plane of the diaphragm wherein light from the light source passes through the objective lens and illuminates a portion of the wafer surface;

a reticle plane located at a focal plane of the wafer on the opposite side of the objective lens, wherein light reflected from the wafer passes through the objective lens and transilluminates a reticle located in the reticle plane;

an observation section including a phase plate located at a focal plane of the diaphragm, said phase plate including an attenuating ring corresponding in size to an image of the annular diaphragm formed on the phase plate;

a video camera located at a focal plane of both the wafer surface and reticle plane, wherein said observation section lies in an optical path which is separate from the optical path between the illumination section and the wafer, and wherein:

the observation section forms an image of the alignment target which is surrounded by a bright edge halo, and wherein the apparatus further includes:

detection means connected to the output of the video camera for determining the position of the alignment target as a function of the detected position of the halo on either edge of the alignment target.

4. The apparatus of claim 3 wherein the objective lens is telecentric and further including a beam splitter located between the illumination section and the observation section for providing first and second optical paths from the wafer, wherein the illumination section is located in the first optical path and the observation section is located in the second optical path.

5. The apparatus of claim 3 wherein the detection means comprises means for detecting the slope of the output signal of the video camera.

6. An optical alignment system for detecting alignment between an alignment target located on a first surface with an alignment indicia located on a transparent surface spaced from the first surface, comprising:

a lens system located between the first and transparent surfaces, wherein the first and transparent surfaces are located in focal planes of the lens system;

a light source for forming an illumination pattern of controlled geometry in one or more focal planes spaced from the first and transparent surfaces, wherein light from the light source is projected through the lens system to illuminate the alignment target and reflects from the first surface back through the lens system to transilluminate the transparent surface in the vicinity of the alignment indicia;

an observation system independent from the light source for forming superimposed images of the alignment target and alignment indicia in a viewing plane located in a common focal plane of the first and transparent surfaces, said observation system including a main lens for focusing images onto the viewing plane and a transparent phase plate located in a focal plane of the light source, wherein the phase plate includes an attenuating portion of a geometry and size corresponding to the image formed by the light source at the phase plate, whereby the contrast of the image of the alignment target formed in the viewing plate is enhanced due to phase differences between light reflected from the alignment target and light reflected from the surrounding area of the first surfaces;

video scanning means located in the viewing plane for providing a video scan signal of the images formed in the viewing plane;

detection means connected to the scanning means for determining the relative position of the alignment target, and wherein:

the image of the alignment target includes a bright halo around the edge thereof, and wherein:

the detection means includes means for detecting video signal characteristics indicative of the scanning of said halo.

7. The alignment system of claim 6 wherein the detection means comprises means for detecting amplitude differences in the video scan signal.

8. The apparatus of claim 6 wherein the alignment indicia comprises an opaque area surrounding a transparent window, wherein the alignment target is viewed through the transparent window.

* * * * *